(12) United States Patent
Shimizu et al.

(10) Patent No.: US 12,467,139 B2
(45) Date of Patent: Nov. 11, 2025

(54) MULTIZONE FLOW DISTRIBUTION SYSTEM

(71) Applicant: APPLIED MATERIALS, INC., Santa Clara, CA (US)

(72) Inventors: Daisuke Shimizu, Milpitas, CA (US); Taiki Hatakeyama, San Jose, CA (US); Sean S. Kang, San Ramon, CA (US); Chunlei Zhang, Santa Clara, CA (US); Sergio F. Shoji, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 566 days.

(21) Appl. No.: 16/370,783

(22) Filed: Mar. 29, 2019

(65) Prior Publication Data
US 2020/0312680 A1    Oct. 1, 2020

(51) Int. Cl.
| | |
|---|---|
| *C23C 16/455* | (2006.01) |
| *H01J 37/32* | (2006.01) |
| *H01L 21/67* | (2006.01) |

(52) U.S. Cl.
CPC .. *C23C 16/45565* (2013.01); *C23C 16/45561* (2013.01); *H01J 37/3244* (2013.01); *H01J 37/32449* (2013.01); *H01L 21/67069* (2013.01); *H01J 37/32091* (2013.01)

(58) Field of Classification Search
CPC ........... H01J 37/32091; H01J 37/32431; H01J 37/3244; H01J 37/32449; C23C 16/455; C23C 16/45561; C23C 16/45563; C23C 16/45565; C23C 16/45568; C23C 16/45574; H01L 21/67069
See application file for complete search history.

(56) References Cited

U.S. PATENT DOCUMENTS

| | | | | | |
|---|---|---|---|---|---|
| 5,683,517 | A | * | 11/1997 | Shan | C23C 16/5096 118/723 E |
| 5,718,976 | A | * | 2/1998 | Dorfman | C23C 14/221 428/408 |
| 5,958,140 | A | * | 9/1999 | Arami | C23C 16/45574 118/725 |
| 6,451,703 | B1 | * | 9/2002 | Liu | H01L 21/76802 257/E21.252 |
| 6,473,993 | B1 | * | 11/2002 | Yagi | H01L 21/67109 118/715 |

(Continued)

*Primary Examiner* — Kurt Sweely
(74) *Attorney, Agent, or Firm* — Moser Taboada

(57) ABSTRACT

Methods and apparatus for controlling fluid distribution to multiple fluid delivery zones in an etch chamber is provided herein. In some embodiments, the apparatus includes a first flow ratio controller and a second flow ratio controller, each having a respective inlet, a first outlet coupled to a first fluid delivery zone in a process chamber, and a second outlet coupled to a second fluid delivery zone in the process chamber, wherein the first flow ratio controller and the second flow ratio controller are configured to provide a flow ratio of a first process fluid and a second process fluid, respectively, between the first outlet and the second outlet, and a third flow ratio controller configured to provide a flow rate of a third process fluid to at least one of the first fluid delivery zone, the second fluid delivery zone, or a third fluid delivery zone.

16 Claims, 2 Drawing Sheets

(56) References Cited

U.S. PATENT DOCUMENTS

| | | | |
|---|---|---|---|
| 7,842,190 B2 * | 11/2010 | Kitamura | H01L 21/31138 |
| | | | 216/72 |
| 7,972,470 B2 * | 7/2011 | Furuta | H01J 37/32623 |
| | | | 156/345.47 |
| 9,405,298 B2 | 8/2016 | Geoffrion et al. | |
| 9,460,893 B2 * | 10/2016 | Kawamata | H01J 37/32091 |
| 2011/0265883 A1 | 11/2011 | Cruse et al. | |
| 2014/0261805 A1 | 9/2014 | Nangoy et al. | |
| 2015/0371831 A1 | 12/2015 | Rozenzon et al. | |
| 2015/0371889 A1 * | 12/2015 | Kim | H01L 21/3081 |
| | | | 438/714 |
| 2017/0047200 A1 * | 2/2017 | Lee | H01J 37/32532 |
| 2017/0213699 A1 | 7/2017 | Rogers | |
| 2018/0053676 A1 * | 2/2018 | White | H01L 21/6833 |

* cited by examiner

MULTIZONE FLOW DISTRIBUTION SYSTEM

FIELD

Embodiments of the present disclosure generally relate to substrate processing equipment and techniques.

BACKGROUND

Fluid processing systems are often used in the semiconductor industry, for example, in processes such as chemical vapor deposition (CVD), high-density plasma chemical vapor deposition (HDPCVD), atomic layer deposition (ALD), etching, or the like. Systems, apparatus, and methods to distribute the flow of process fluids into a process chamber in a desired ratio typically to process a substrate make use of multiple mass flow controllers (MFCs) to accurately control the desired flow distribution. However, each MFC is typically calibrated for a specific process fluid and, thus, do not operate properly for different process fluids or for complex mixtures of process fluids. Further, the inventors have observed that for certain applications, the use of conventional flow distribution systems have led to non-uniform etching rates among a center, middle, and edge region of a substrate that is being processed.

Accordingly, the inventors have provided improved methods and apparatus for distributing process fluids to a process chamber.

SUMMARY

Methods and apparatus for controlling fluid distribution to multiple fluid delivery zones in an etch chamber are provided herein. In some embodiments, the apparatus includes a first flow ratio controller having an inlet, a first outlet, and a second outlet, wherein the first outlet is fluidly coupled to a first fluid delivery zone in a process chamber via a first fluid line and the second outlet is fluidly coupled to a second fluid delivery zone in the process chamber, via a second fluid line, and wherein the first flow ratio controller is configured to provide a flow ratio of a first process fluid between the first outlet and the second outlet; a second flow ratio controller having an inlet, a first outlet, and a second outlet, wherein the first outlet is fluidly coupled to the first fluid delivery zone via the first fluid line and the second outlet is fluidly coupled to the second fluid delivery zone via the second fluid line, and wherein the second flow ratio controller is configured to provide a flow ratio of a second process fluid between the first outlet and the second outlet; and a third flow ratio controller having an inlet, a first outlet, a second outlet, and a third outlet, the first outlet is fluidly coupled to the first fluid delivery zone via the first fluid line, the second outlet is fluidly coupled to the second fluid delivery zone via the second fluid line, and the third outlet is fluidly coupled to a third fluid delivery zone in the process chamber via a third fluid line, wherein the third flow ratio controller is configured to provide a flow rate of a third process fluid to at least one of the first fluid delivery zone, second fluid delivery zone, or the third fluid delivery zone.

In some embodiments, a flow distribution system includes a first fluid source to provide a first process fluid, the first fluid source coupled to a first flow ratio controller via a first mass flow controller; a second fluid source to provide a second process fluid the second fluid source coupled to a second flow ratio controller via a second mass flow controller; a third fluid source to provide a third process fluid coupled to third flow ratio controller via a third mass flow controller; and a showerhead having a central region, a middle region, and an edge region, and a plurality of inlets configured to deliver the first process fluid, the second process fluid, and the third process fluid at a predetermined flow ratio to each of the central region, the middle region, and the edge region, wherein each inlet of the plurality of inlets is fluidly coupled to at least one of the first flow ratio controller, the second flow ratio controller, and the third flow ratio controller.

In some embodiments, a method for controlling fluid distribution to multiple fluid delivery zones includes flowing a first process fluid through a first flow ratio controller to provide a first flow rate of the first process fluid to a first gas delivery zone in a process chamber and a second flow rate of the first process fluid to a second gas delivery zone in the process chamber, wherein the first process fluid comprises one or more reactant gases; flowing a second process fluid through a second flow ratio controller to provide a first flow rate of the second process fluid to the first gas delivery zone and a second flow rate of the second process gas to the second gas delivery zone, wherein the second process gas is one or more inert gases; and flowing a third process gas through a third flow ratio controller to at least one of the first gas delivery zone, the second gas delivery zone, or a third gas delivery zone in the process chamber.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
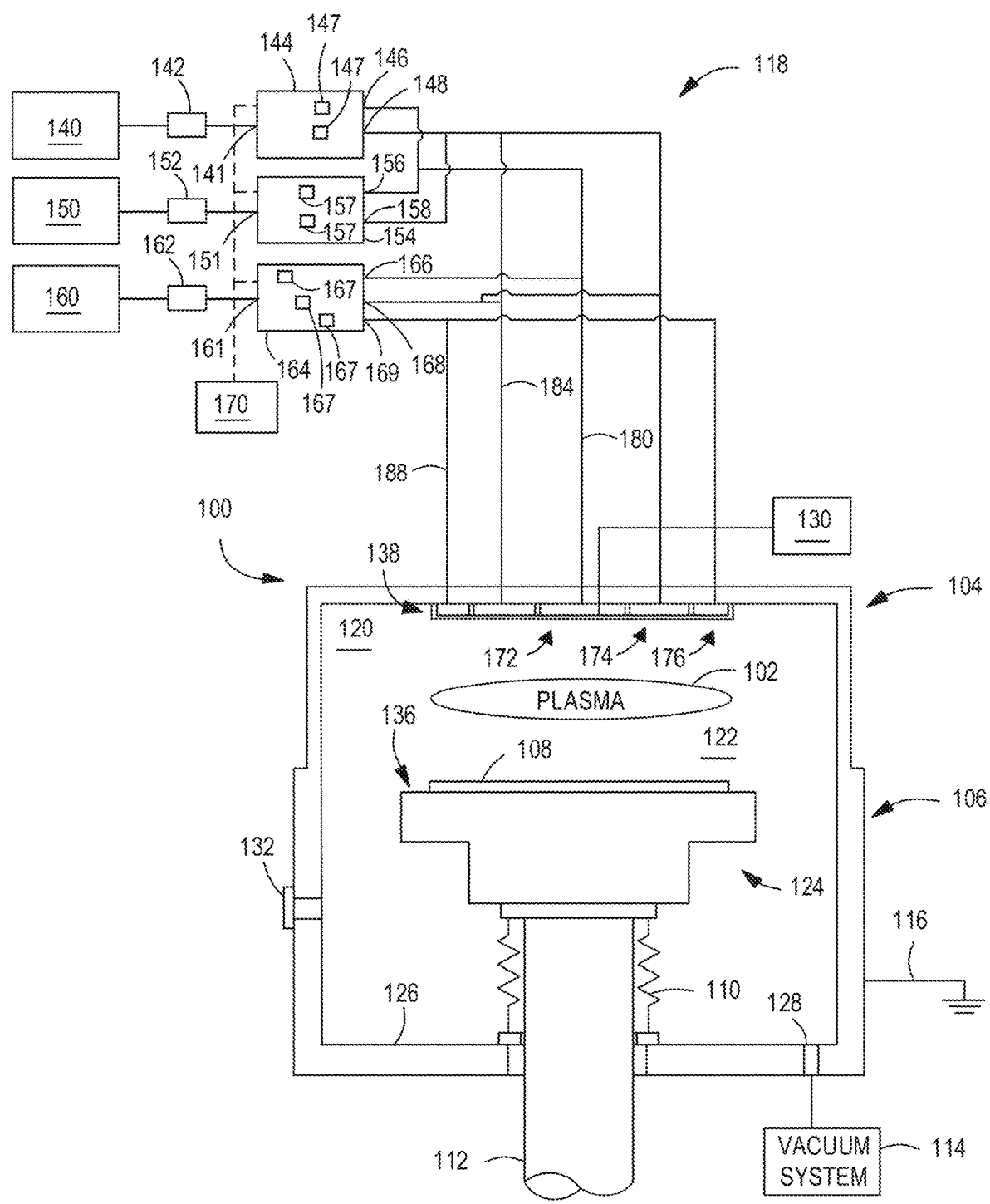
FIG. 1 is a schematic illustration of a flow distribution system in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods and apparatus of a flow distribution system for controlling fluid distribution to multiple fluid delivery zones in a process chamber are provided herein. In some embodiments, the flow distribution system includes a plurality of fluid sources coupled to a corresponding plurality of mass flow controllers coupled to a corresponding plurality of flow ratio controllers. The plurality of mass flow controllers are configured to control the total flow rate of the process fluid provided to the respective flow ratio controllers. Each flow ratio controller of the plurality of flow ratio controllers is fluidly coupled to multiple fluid delivery zones to advantageously control a flow rate and flow ratio of process fluid from the plurality of fluid sources, or fluid composition, delivered to each fluid delivery zone. For example, in some embodiments, the plurality of fluid sources includes a reactant gas source and an inert gas source. The flow distribution system is configured to provide a predetermined concentration ratio of reactant gas and inert gas, or a predetermined composition of a gaseous mixture, to each fluid delivery zone. Individual control of the fluid composition at each fluid delivery zone advantageously facilitates uniform processing of a substrate in a process chamber. For example, processing of a substrate can include removing material from a substrate via etching. The fluid delivery zones may generally be any zones where control over the fluid flow ratio is desired.

FIG. 1 is a simplified schematic illustration of a flow distribution system 118 coupled to a process chamber 100 in accordance with some embodiments of the present disclosure. In some embodiments, the process chamber 100 is an etching chamber. However, other types of processing chambers can also be used or be modified for use with embodiments of the flow distribution system 118 described herein. The process chamber 100 is a vacuum chamber which is suitably adapted to maintain sub-atmospheric pressures within an interior volume 120 of the process chamber 100 during substrate processing, such as for example high temperature and/or high power substrate processing. The process chamber 100 includes a chamber body 106 covered by a lid 104 which encloses a processing volume 122 located in an upper portion of the interior volume 120. The chamber body 106 and lid 104 may be made of metal, such as aluminum. The chamber body 106 may be grounded via a coupling to ground 116. The lid 104 can be electrically floated or grounded.

A substrate support 124 is disposed within the interior volume 120 to support and retain a substrate 108, such as a semiconductor substrate, for example, or other such substrate that may be electrostatically retained. The substrate support 124 may generally comprise a pedestal 136 and a support shaft 112 for supporting the pedestal 136. The support shaft 112 may be hollow and provides a conduit to provide, for example, process gases, fluids, coolants, power, or the like, to the pedestal 136.

In some embodiments, a bellows 110 is disposed about the support shaft 112 and is coupled between the pedestal 136 and a bottom surface 126 of the process chamber 100 to provide a flexible seal that allows vertical motion of the pedestal 136 while preventing loss of vacuum from within the process chamber 100. Alternatively or in combination, a bellows (not shown) can be disposed about the support shaft 112 and can be coupled between a portion of the support shaft 112 disposed outside of the process chamber 100 and an exterior bottom surface of the process chamber 100 to provide a flexible seal that allows vertical motion of the pedestal 136 while preventing loss of vacuum from within the process chamber 100.

The process chamber 100 is coupled to and in fluid communication with a vacuum system 114, for example via an exhaust port 128 in the process chamber. The vacuum system 114 includes a throttle valve and vacuum pump, which are used to exhaust the process chamber 100. The pressure inside the process chamber 100 may be regulated at least in part by adjusting the throttle valve and/or vacuum pump.

In operation, the substrate 108 may enter the process chamber 100 via a selectively sealable opening in the chamber body 106, for example, a slit valve 132. The opening may be selectively sealed via a door of the slit valve 132, or other apparatus for selectively providing access to the interior of the process chamber 100 through the opening. Further, in operation, a plasma 102 may be created in the interior volume 120 to perform one or more processes. The plasma 102 may be created by coupling power from a plasma power source (e.g., RF plasma power supply 130) to one or more process fluids proximate to or within the interior volume 120 to ignite the process fluids to create the plasma 102.

A plurality of process fluids may be introduced into the interior volume 120 in a plurality of fluid delivery zones. In some embodiments, the plurality of fluid delivery zones correspond to regions on the substrate 108, such as for example, a central region, an annular middle region surrounding the central region, and an annular edge position surrounding the annular middle region. The plurality of process fluids may be introduced into the interior volume 120 in any suitable manner such as by one or more of gas inlets, nozzles, showerheads, or the like. In some embodiments, the plurality of process fluids are introduced into the interior volume 120 via a showerhead 138 installed in an upper region of the process chamber 100, such as in or on the lid 104, opposite the pedestal 136.

In some embodiments, the plurality of fluid delivery zones are defined within the showerhead 138. For example, in some embodiments, the showerhead includes a first fluid delivery zone 172, a second fluid delivery zone 174, and a third fluid delivery zone 176. In some embodiments, a central region of the showerhead 138 corresponds with the first fluid delivery zone 172. In some embodiments, a middle region of the showerhead 138 corresponds with the second fluid delivery zone 174. In some embodiments, an edge region of the showerhead 138 corresponds with the third fluid delivery zone 176. The showerhead 138 is coupled to and in fluid communication with the flow distribution system 118 to a plurality of process fluids, via the showerhead 138, to the process chamber 100 for processing a substrate disposed therein.

The vacuum system 114 is generally disposed on one side of the process chamber 100. Fluid residence time over the substrate 108 is different for the fluid introduced over a center of the substrate 108 as compared to fluid introduced over an edge of the substrate 108. Fluid introduced over the center flows from the center to an edge of the substrate 108 and then to a pump port of the vacuum system 114. Fluid introduced over the edge of the substrate 108 flows immediately over the edge to the pump port. The difference leads to process nonuniformities, especially for substrate processing applications having smaller critical dimensions and high aspect ratio features. The addition of a third fluid delivery zone, such as the third fluid delivery zone 176, at an outermost portion, or extreme edge of the substrate 108, through a flow ratio controller or independent gas injector advantageously allows for compensation for process nonuniformities that arise using a system having only two fluid delivery zones.

As shown in FIG. 1, the flow distribution system 118 controls a fluid flow and composition to each of the first fluid delivery zone 172, the second fluid delivery zone 174, and the third fluid delivery zone 176. In some embodiments, the fluid flow can include gas flow or fluid droplets entrained in a gas flow. In some embodiments, the flow distribution system 118 may be expanded in accordance with the principles disclosed herein to provide fluid flow to additional fluid delivery zones. The flow distribution system 118 generally includes a first flow ratio controller 144, a second flow ratio controller 154, and a third flow ratio controller 164 coupled to a controller 170.

The controller 170 facilitates user selection and control of a predetermined flow ratio for each of the first, second, and third ratio controllers 144, 154, 164. The controller 170 facilitates control of the first, the second, and the third flow ratio controllers 144, 154, 164 to distribute flow of process fluids according to the predetermined flow ratio. The controller 170 may provide for the control of the flow distribution system using pre-determined process recipes selected by a user or as part of a fabrication sequence. Alternatively or in combination, the controller 170 may provide for control of the flow division via manual entry of the desired flow rates, flow ratios, valve settings, or the like. Control of the predetermined flow ratio for each of the first, second, and third ratio controllers 144, 154, 164 advantageously provides for control of the flow rate and composition of process fluids provided to the fluid delivery zones within the process chamber 100, such as the first fluid delivery zone 172, the second fluid delivery zone 174, and the third fluid delivery zone 176.

The controller 170 may include a central processing unit (CPU), a memory, and support circuits. The CPU may be any form of a general-purpose computer processor used in an industrial setting. Software routines can be stored in the memory, such as random access memory, read only memory, floppy or hard disk, or other form of digital storage. The support circuits are conventionally coupled to the CPU and may comprise cache, clock circuits, input/output sub-systems, power supplies, and the like. The software routines, when executed, transform the general purpose computer processor into a specific purpose computer (controller 170) that controls the chamber operation such that the methods disclosed herein are performed.

The first flow ratio controller 144 includes an inlet 141, and a plurality of outlets. The inlet 141 is coupled to a first fluid source 140 that provides a first process fluid (e.g., one or more process gases or gaseous mixtures) to the first flow ratio controller 144. In some embodiments, the inlet 141 is fluidly coupled to the first fluid source 140 through a first mass flow controller (MFC) 142. The first MFC 142 is configured to control the total flow rate of the first process fluid provided to the first flow ratio controller 144. In some embodiments, the first fluid source 140 includes a reactant gas or an inert gas. In some embodiments, the first fluid source 140 provides only one or more reactant gases. In some embodiments, the first fluid source 140 provides one or more reactant gases mixed with one or more inert gases. In some embodiments, reactant gases provided by the first fluid source 140 include one or more of tetrafluoropropene ($C_3H_2F_4$), hexafluorobutadiene ($C_4F_6$), hexafluoropropene ($C_3F_6$), hexafluorocyclopropane ($C_3F_6$), or oxygen (O2).

In some embodiments, each outlet of the first flow ratio controller 144 are coupled to different fluid delivery zones. In some embodiments, the plurality of outlets includes a first outlet 146 and a second outlet 148. In some embodiments, the plurality of outlets includes only two outlets, e.g., the first outlet 146 and the second outlet 148. The first outlet 146 is fluidly coupled to the first fluid delivery zone 172 via a first fluid line 180. The second outlet 148 is fluidly coupled to the second fluid delivery zone 174 via a second fluid line 184. In some embodiments, the first flow ratio controller 144 includes a plurality of control valves 147, corresponding with the plurality of outlets, coupled between the inlet 141 and the plurality of outlets (e.g., the first outlet 146 and the second outlet 148). In some embodiments, the plurality of control valves 147 includes two control valves. The plurality of control valves may be any suitable control valves for use in a semiconductor fabrication environment. The first flow ratio controller 144 is configured to provide a flow ratio of the first process fluid between the first outlet 146 and the second outlet 148 to distribute the first process fluid received at the inlet 141 to the first fluid delivery zone 172 and the second fluid delivery zone 174, respectively.

Similar to the first flow ratio controller 144, the second flow ratio controller 154 includes an inlet 151, and a plurality of outlets. The inlet 151 is coupled to a second fluid source 150, separate from the first fluid source 140, that provides a second process fluid (e.g., one or more process gases or gaseous mixtures) to the second flow ratio controller 154. In some embodiments, the inlet 151 is fluidly coupled to the second fluid source 150 through a second MFC 152. The second MFC 152 is configured to control the total flow rate of the second process fluid provided to the second flow ratio controller 154. Separating the first fluid source 140 from the second fluid source 150 allows for individual control of the flow rate and composition of process fluids provided to the fluid delivery zones within the process chamber 100. In some embodiments, the second fluid source 150 includes a reactant gas or an inert gas. In some embodiments, the second fluid source 150 includes fluorocarbon iodide ($CFI_3$). In some embodiments, the second fluid source 150 includes only one or more inert gases. In some embodiments, the inert gas provided by the second fluid source 150 is one or more of krypton (Kr), argon (Ar), or xenon (Xe).

In some embodiments, each outlet of the second flow ratio controller 154 is coupled to different fluid delivery zones. In some embodiments, the plurality of outlets of the second flow ratio controller 154 includes a first outlet 156 and a second outlet 158. In some embodiments, the plurality of outlets includes only two outlets, e.g., the first outlet 156 and the second outlet 158. The first outlet 156 is fluidly coupled to the first fluid delivery zone 172 via the first fluid line 180. Thus, in some embodiments, the first outlet 156 and the first outlet 146 of the first flow ratio controller 144 are both coupled to the first fluid delivery zone 172 via the first fluid line 180. The second outlet 148 is fluidly coupled to the second fluid delivery zone 174 via the second fluid line 184. Thus, in some embodiments, the second outlet 158 and the second outlet 148 of the first flow ratio controller 144 are both fluidly coupled to the second fluid delivery zone 174 via the second fluid line 184. In some embodiments, the second flow ratio controller 154 includes a plurality of control valves 157, corresponding with the plurality of outlets, coupled between the inlet 151 and the plurality of outlets (e.g., the first outlet 156 and the second outlet 158). In some embodiments, the plurality of control valves 157 includes two control valves. The second flow ratio controller 154 is configured to provide a flow ratio of the second process fluid between the first outlet 156 and the second outlet 158 to distribute the second process fluid received at the inlet 151 to the first fluid delivery zone 172 and the second fluid delivery zone 174, respectively.

The third flow ratio controller 164 includes an inlet 161 and a plurality of outlets. In some embodiments, the third flow ratio controller 164 is an independent gas injector comprising one or more on/off valves. In some embodiments, the third flow ratio controller 164 is an independent gas injector wherein each of the plurality of outlets includes an on/off valve to independently open or close each respective outlet. The inlet 161 is coupled to a third fluid source 160, separate from the first fluid source 140 and the second fluid source 150, that provides a third process fluid (e.g., one or more process gases or gaseous mixtures) to the third flow ratio controller 164. In some embodiments, the inlet 161 is fluidly coupled to the third fluid source 160 through a third MFC 162. The third MFC 162 is configured to control the total flow rate of the third process fluid provided to the third flow ratio controller 164.

In some embodiments, the third process fluid is a reactant gas. In some embodiments, the third fluid source 160 provides only one or more reactant gases. In some embodiments, the third fluid source 160 provides one or more reactant fluids mixed with one or more inert gases. In some embodiments, the third process fluid is an inert gas. In some embodiments, the third fluid source 160 provides only one or more inert gases. In some embodiments, the third process fluid is different than the first process fluid. In some embodiments, the third process fluid is the same as the first process fluid. In some embodiments, the third process fluid is different than the second process fluid. In some embodiments, the third process fluid is the same as the second process fluid. In some embodiments, the third process fluid is the same as at least one of the first process fluid and the second process fluid. In some embodiments, the third process fluid provided by the third fluid source 160 is one or more of tetrafluoropropene ($C_3H_2F_4$), hexafluoropropene ($C_3F_6$), hexafluorocyclopropane ($C_3F_6$), hexafluorobutadiene ($C_4F_6$), oxygen ($O_2$), fluorocarbon iodide ($CH_3$), krypton (Kr), argon (Ar), or xenon (Xe).

In some embodiments, each outlet of the third flow ratio controller 164 is coupled to different fluid delivery zones. In some embodiments, the plurality of outlets of the third flow ratio controller 164 includes a first outlet 166, a second outlet 168, and a third outlet 169. The first outlet 166 is fluidly coupled to the first fluid delivery zone 172 via the first fluid line 180. Thus, in some embodiments, the first outlet 166, the first outlet 146 of the first flow ratio controller 144, and the first outlet 156 of the second flow ratio controller 154 are each coupled to the first fluid delivery zone 172 via the first fluid line 180. The second outlet 148 is fluidly coupled to the second fluid delivery zone 174 via the second fluid line 184. Thus, in some embodiments, the second outlet 168, the second outlet 148 of the first flow ratio controller 144, and the second outlet 158 of the second flow ratio controller 154 are each coupled to the second fluid delivery zone 174 via the second fluid line 184. The third outlet 169 is fluidly coupled to the third fluid delivery zone 176 via a third fluid line 188.

The third flow ratio controller 164 is configured to provide a flow ratio of the third process fluid between the first outlet 166, the second outlet 168, and the third outlet 169 to distribute the third process fluid received at the inlet 161 to at least one of the first fluid delivery zone 172, the second fluid delivery zone 174, and the third fluid delivery zone 176, respectively. In some embodiments, the third flow ratio controller 164 is an independent gas injector having three valves 16Z with outlets corresponding with the first outlet 166, the second outlet 168, and the third outlet 169. In some embodiments, the third flow ratio controller 164 is an independent gas injector having three individual on/off valves 167 corresponding with the first outlet 166, the second outlet 168, and the third outlet 169. In some embodiments, the third flow ratio controller 164 only provides the third process fluid to the third fluid delivery zone 176. In some embodiments, the third fluid delivery zone 176 only receives a process fluid from the third flow ratio controller 164.

In some embodiments, both the first outlet 146 of the first flow ratio controller 144 and the first outlet 156 of the second flow ratio controller 154 are fluidly coupled to the first fluid line 180 upstream of the first outlet 166 of the third flow ratio controller 164. In some embodiments, both the second outlet 148 of the first flow ratio controller 144 and the second outlet 158 of the second flow ratio controller 154 are fluidly coupled to the second fluid line 184 upstream of the second outlet 168 of the third flow ratio controller 164. As such, the first process fluid and the second process fluid respectively provided by the first outlet 146 of the first flow ratio controller 144 and the first outlet 156 of the second flow ratio controller 154 are mixed within the first fluid line 180 upstream of the junction with the first outlet 166 of the third flow ratio controller 164. Similarly, the first process fluid and the second process fluid respectively provided by the second outlet 148 of the first flow ratio controller 144 and the second outlet 158 of the second flow ratio controller 154 are mixed within the second fluid line 184 upstream of the junction with the second outlet 168 of the third flow ratio controller 164.

The configuration of the flow distribution system 118 may be determined based upon the anticipated operating conditions and output requirements for a particular application. For example, in some embodiments, each of the first and second flow ratio controllers 144, 154 may provide flow ratios between 1:1 and 6:1 in half ratio increments (i.e., 1/1, 1.5/1, 2/1, 2.5/1 . . . 6/1) and be fully reversible (i.e., 1/1, 1/1.5, 2/1, 2.5/1 . . . 1/6) between the first fluid delivery zone 172 and the second fluid delivery zone 174. In some embodiments, the accuracy of the fluid flow split may be within 5 percent, for example, to match the performance of existing equipment.

Figure 2:
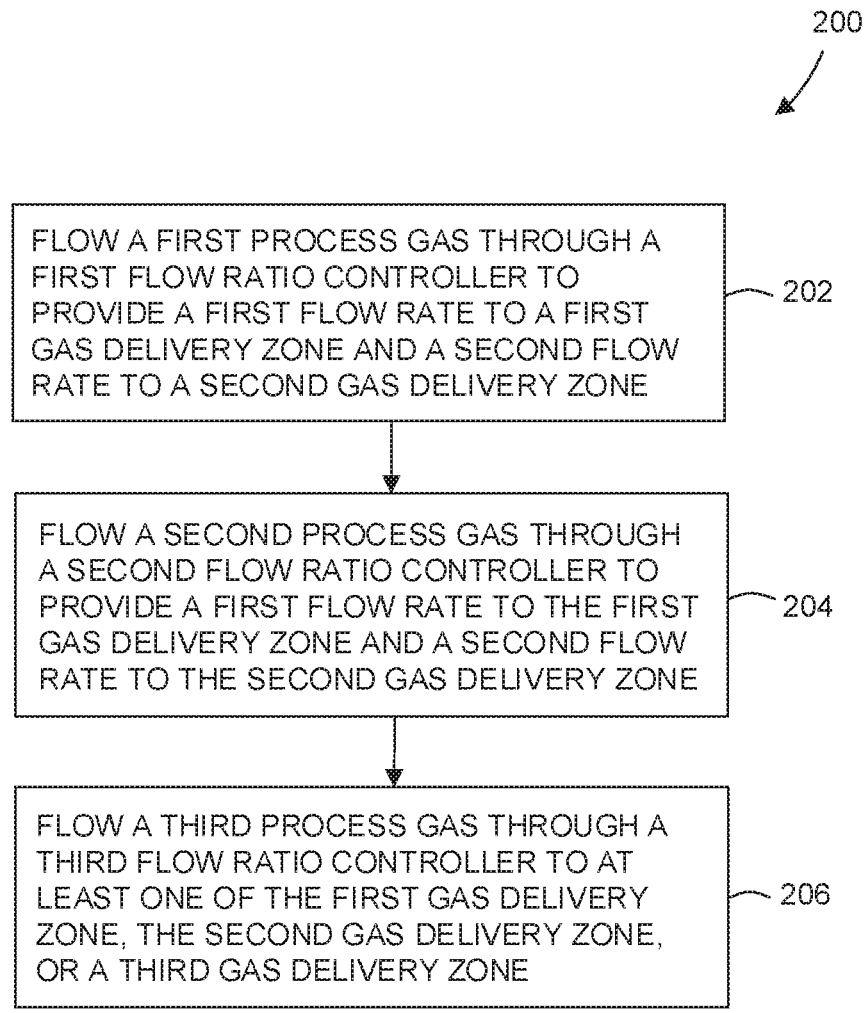
FIG. 2 is a flow chart of a method of distributing process fluid to multiple fluid delivery zones in accordance with some embodiments of the present disclosure.

FIG. 2 is a flow chart of a method 200 of distributing process fluid to multiple fluid delivery zones in accordance with some embodiments of the present disclosure. In some embodiments, the flow distribution system 118 described above may be used to perform the method 200. In some embodiments, the method 200 for controlling fluid distribution to multiple fluid delivery zones, at 202, includes flowing a first process fluid through a first flow ratio controller (e.g., first flow ratio controller 144) to provide a first flow rate of the first process fluid to a first fluid delivery zone (e.g., first fluid delivery zone 172) in a process chamber (e.g., process chamber 100) and a second flow rate of the first process fluid to a second fluid delivery zone (e.g., second fluid delivery zone 174) in the process chamber. In some embodiments, the first process fluid comprises one or more reactant gases, such as discussed above with respect to the first fluid source 140. The first flow ratio controller is fluidly coupled to a first fluid source, such as the first fluid source 140 discusses above.

At 204, a second process fluid is flowed through a second flow ratio controller (e.g., second flow ratio controller 154) to provide a first flow rate of the second process fluid to the first fluid delivery zone and a second flow rate of the second process fluid to the second fluid delivery zone. In some embodiments, the second process fluid comprises one or more inert gases, such as discussed above with respect to the second fluid source 150. In some embodiments, the second flow ratio controller is fluidly coupled to a second fluid source, such as the second fluid source 150 discusses above.

At 206, a third process fluid is flowed through a third flow ratio controller (e.g., third flow ratio controller 164) to at least one of the first fluid delivery zone, the second fluid delivery zone, or a third fluid delivery zone (e.g., third fluid delivery zone 176) in the process chamber. In some embodiments, the third flow ratio controller is fluidly coupled to a third fluid source, such as discussed above with respect to the third fluid source 160. In some embodiments, the first fluid source, the second fluid source, and the third fluid source are separate and independent fluid sources.

In some embodiments, the method 200 includes metering each of the first process fluid, the second process fluid, and the third process fluid by a corresponding first mass flow controller (e.g., the first mass controller 142), second mass flow controller (e.g., the second mass controller 152), and third mass flow controller (e.g., the third mass controller 162) prior to flowing each of the first process fluid, the second process fluid, and the third process fluid to the first flow ratio controller, the second flow ratio controller, and the third flow ratio controller, respectively.

Table 1 below shows various cases of input flow rates and distribution ratios of a flow distribution system having a single flow ratio controller (FRC) (e.g., a first FRC) and an independent gas injector (IGI). The IGI is configured to inject additional gas at an outer delivery zone. For example, columns 1 to 3 show an input flow rate of a fluid mixture consisting of hexafluorobutadiene ($C_4F_6$), oxygen ($O_2$), and argon (Ar) flowing through the first FRC. Column 4 shows an input flow rate of a fluid flowing through the IGI, for example, $O_2$. Column 5 shows a ratio of how the fluid mixture flowing through the first FRC is distributed downstream of the first FRC between an inner delivery zone and an outer delivery zone. Case 1, for example, has a ratio of 1:1, and therefore the first FRC is configured to distribute an input flow substantially equally between an inner delivery zone and an outer delivery zone.

TABLE 1

| Case | Flow Rate of $C_4F_6$ (sccm) 1st FRC | Flow Rate of $O_2$ (sccm) 1st FRC | Flow Rate of Ar (sccm) 1st FRC | Flow Rate of $O_2$ (sccm) IGI | Ratio between inner/outer zone 1st FRC |
|---|---|---|---|---|---|
| 1 | 60.0 | 30.0 | 600.0 | 0.0 | 1:1 |
| 2 | 60.0 | 30.0 | 600.0 | 4.0 | 1:1 |
| 3 | 60.0 | 30.0 | 600.0 | 0.0 | 2:1 |
| 4 | 60.0 | 30.0 | 600.0 | 4.0 | 2:1 |
| 5 | 60.0 | 30.0 | 600.0 | 0.0 | 5:1 |
| 6 | 60.0 | 30.0 | 600.0 | 4.0 | 5:1 |

Table 2 below shows output flow rates and output ratio of fluids based on the input parameters for the various cases described above in Table 1. Cases 1 to 6 in row 1 of Table 2 correspond to cases 1 to 6 in column 1 of Table 1. For example, in case 1, the ratio of $C_4F_6/O_2$ at the inner delivery zone and the outer delivery zone is 2.00 and 2.00, respectively, and the ratio of $(C_4F_6+O_2)/Ar$ at the inner delivery zone and the outer delivery zone is 0.15 and 0.15, respectively. Case 2 includes an additional flow rate of 4.0 sccm of $O_2$ provided to the outer delivery zone by the IGI. As such, the ratio of $C_4F_6/O_2$ at the inner delivery zone and the outer delivery zone is 2.00 and 1.58, respectively, and the ratio of $(C_4F_6+O_2)/Ar$ at the inner delivery zone and the outer delivery zone is 0.15 and 0.16, respectively.

As shown in Table 2, the additional fluid flow provided by the IGI can change the ratio of $C_4F_6/O_2$ and $(C_4F_6+O_2)/Ar$ at the outer delivery zone. The additional fluid flow provided by the IGI does not change the same ratios at the inner delivery zone. Table 1 and Table 2 show that a flow distribution system having a single FRC and a single IGI is not able to control a composition of process fluid delivered to multiple zones.

TABLE 2

| Case | | 1 | 2 | 3 | 4 | 5 | 6 |
|---|---|---|---|---|---|---|---|
| Flow Rate of C4F6 (sccm) | Inner Zone | 30 | 30 | 40 | 40 | 50 | 50 |
| | Outer Zone | 30 | 30 | 20 | 20 | 10 | 10 |
| Flow Rate of O2 (sccm) | Inner Zone | 15 | 15 | 20 | 20 | 25 | 25 |
| | Outer Zone | 15 | 19 | 10 | 14 | 5 | 9 |
| Flow Rate of Ar (sccm) | Inner Zone | 300 | 300 | 400 | 400 | 500 | 500 |
| | Outer Zone | 300 | 300 | 200 | 200 | 100 | 100 |
| Ratio of Gases C4F6/O2 | Inner Zone | 2.00 | 2.00 | 2.00 | 2.00 | 2.00 | 2.00 |
| Ratio of Gases C4F6/O2 | Outer Zone | 2.00 | 1.58 | 2.00 | 1.43 | 2.00 | 1.11 |
| Ratio of Gases (C4F6 + O2)/Ar | Inner Zone | 0.15 | 0.15 | 0.15 | 0.15 | 0.15 | 0.15 |
| Ratio of Gases (C4F6 + O2)/Ar | Outer Zone | 0.15 | 0.16 | 0.15 | 0.17 | 0.15 | 0.19 |

Table 3 below shows various cases of input flow rates and flow ratios of a flow distribution system having three FRCs as described herein (e.g., the first FRC 144, the second FRC 154, and the third FRC 164). For example, column 2 shows an input flow rate of a fluid flowing through the first FRC, for example, $O_4F_6$. Column 3 shows an input flow rate of a fluid flowing through the second FRC, for example, $O_2$. Columns 4 to 6 show an input flow rate of a fluid mixture consisting of $C_4F_6$, $O_2$, and Ar flowing through the third FRC. Columns 7 to 9 show a ratio of how the fluid mixture flowing through the first FRC, the second FRC, and the third FRC are distributed downstream between an inner and outer delivery zone, and an inner, outer, and edge delivery zone, respectively.

Case 1, for example, has a ratio of 1:1, 1:1, and 1:1:1 for the first FRC, the second FRC, and the third FRC, respectively. Therefore the first FRC and the second FRC are configured to distribute an input flow substantially equally between an inner delivery zone and an outer delivery zone. The third FRC is configured to distribute an input flow substantially equally between an inner delivery zone, and outer delivery zone, and an edge delivery zone.

above in Table 3. Cases 1 to 7 in row 1 of Table 4 correspond to cases 1 to 7 in column 1 of Table 3. For example, in case 1, the ratio of $C_4F_6/O_2$ at the inner delivery zone, the outer delivery zone, and the edge delivery zone is 2.00, 2.00, and 2.00, respectively, and the ratio of $(C_4F_6+O_2)/Ar$ at the inner delivery zone, the outer delivery zone, and the edge delivery zone is 0.15, 0.15, and 0.15, respectively. Case 7 includes an additional flow rate of 12.0 sccm of $O_2$ provided to the first FRC and an additional flow rate of 12.0 sccm of $C_4F_6$ provided to the second FRC. As such, the ratio of $C_4F_6/O_2$ at the inner delivery zone, the outer delivery zone, and the edge delivery zone is 1.55, 2.30, and 2.00, respectively, and the ratio of $(C_4F_6+O_2)/Ar$ at the inner delivery zone, the outer delivery zone, and the edge delivery zone is 0.17, 0.18, and 0.15, respectively.

As shown in Table 4, the additional fluid flow provided by the first FRC and the second FRC can advantageously change the ratio of $C_4F_6/O_2$ and $(C_4F_6+O_2)/Ar$ at both the outer delivery zone and the inner delivery zone, while keeping the ratios the same at the edge delivery zone. Table 3 and Table 4 show that a flow distribution system having three FRCs is able to more effectively control a composition of process fluid delivered to multiple zones.

TABLE 3

| Case | Flow Rate of C4F6 (sccm) 1st FRC | Flow Rate of O2 (sccm) 2rd FRC | Flow Rate of C4F6 (sccm) 3rd FRC | Flow Rate of O2 (sccm) 3rd FRC | Flow Rate of Ar (sccm) 3rd FRC | Ratio between inner/outer zone 1st FRC | Ratio between inner/outer zone 2nd FRC | Ratio between inner/outer zone/edge zones 3rd FRC |
|---|---|---|---|---|---|---|---|---|
| 1 | 0.0 | 0.0 | 108.0 | 54.0 | 1080.0 | 1:1 | 1:1 | 1:1:1 |
| 2 | 0.0 | 12.0 | 108.0 | 54.0 | 1080.0 | 1:1 | 1:1 | 1:1:1 |
| 3 | 0.0 | 12.0 | 108.0 | 54.0 | 1080.0 | 1:1 | 2:1 | 3:2:1 |
| 4 | 0.0 | 12.0 | 108.0 | 54.0 | 1080.0 | 1:1 | 5:1 | 5:3:1 |
| 5 | 12.0 | 12.0 | 108.0 | 54.0 | 1080.0 | 1:1 | 1:1 | 1:1:1 |
| 6 | 12.0 | 12.0 | 108.0 | 54.0 | 1080.0 | 1:2 | 2:1 | 3:2:1 |
| 7 | 12.0 | 12.0 | 108.0 | 54.0 | 1080.0 | 1:5 | 5:1 | 5:3:1 |

Table 4 shows output flow rates and ratio of fluids based on the input parameters for the various cases described

TABLE 4

| Case | | 1 | 2 | 3 | 4 | 5 | 6 | 7 |
|---|---|---|---|---|---|---|---|---|
| Flow Rate of C4F6 (sccm) | Inner Zone | 36.0 | 36.0 | 54.0 | 60.0 | 42.0 | 58.0 | 62.0 |
| | Outer Zone | 36.0 | 36.0 | 36.0 | 36.0 | 42.0 | 44.0 | 46.0 |
| | Edge Zone | 36.0 | 36.0 | 18.0 | 12.0 | 36.0 | 18.0 | 12.0 |
| Flow Rate of O2 (sccm) | Inner Zone | 18.0 | 24.0 | 35.0 | 40.0 | 24.0 | 35.0 | 40.0 |
| | Outer Zone | 18.0 | 24.0 | 22.0 | 20.0 | 24.0 | 22.0 | 20.0 |
| | Edge Zone | 18.0 | 18.0 | 9.0 | 6.0 | 18.0 | 9.0 | 6.0 |
| Flow Rate of Ar (sccm) | Inner Zone | 360.0 | 360.0 | 540.0 | 600.0 | 360.0 | 540.0 | 600.0 |
| | Outer Zone | 360.0 | 360.0 | 360.0 | 360.0 | 360.0 | 360.0 | 360.0 |
| | Edge Zone | 360.0 | 360.0 | 180.0 | 120.0 | 360.0 | 180.0 | 120.0 |
| Ratio of Gases C4F6/O2 | Inner Zone | 2.00 | 1.50 | 1.54 | 1.50 | 1.75 | 1.66 | 1.55 |
| Ratio of Gases C4F6/O2 | Outer Zone | 2.00 | 1.50 | 1.64 | 1.80 | 1.75 | 2.00 | 2.30 |

TABLE 4-continued

| Case | | 1 | 2 | 3 | 4 | 5 | 6 | 7 |
|---|---|---|---|---|---|---|---|---|
| Ratio of Gases C4F6/O2 | Edge Zone | 2.00 | 2.00 | 2.00 | 2.00 | 2.00 | 2.00 | 2.00 |
| Ratio of Gases (C4F6 + O2)/Ar | Inner Zone | 0.15 | 0.17 | 0.17 | 0.17 | 0.18 | 0.17 | 0.17 |
| Ratio of Gases (C4F6 + O2)/Ar | Outer Zone | 0.15 | 0.17 | 0.16 | 0.16 | 0.18 | 0.18 | 0.18 |
| Ratio of Gases (C4F6 + O2)/Ar | Edge Zone | 0.15 | 0.15 | 0.15 | 0.15 | 0.15 | 0.15 | 0.15 |

While the foregoing is directed to embodiments of the present disclosure, other and further embodiments of the disclosure may be devised without departing from the basic scope thereof.

The invention claimed is:

1. An apparatus for controlling fluid distribution to multiple fluid delivery zones in an etch chamber, comprising:
a first flow ratio controller having an inlet, a first outlet, and a second outlet, wherein the first outlet is fluidly coupled to a first fluid delivery zone in a process chamber via a first fluid line and the second outlet is fluidly coupled to a second fluid delivery zone in the process chamber, via a second fluid line, and wherein the first flow ratio controller is configured to provide a flow ratio of a first process fluid between the first outlet and the second outlet;
a second flow ratio controller having an inlet, a first outlet, and a second outlet, wherein the first outlet is fluidly coupled to the first fluid delivery zone via the first fluid line and the second outlet is fluidly coupled to the second fluid delivery zone via the second fluid line, and wherein the second flow ratio controller is configured to provide a flow ratio of a second process fluid between the first outlet and the second outlet; and
a third flow ratio controller having an inlet, a first outlet, a second outlet, and a third outlet, the first outlet is fluidly coupled to the first fluid delivery zone via the first fluid line, the second outlet is fluidly coupled to the second fluid delivery zone via the second fluid line, and the third outlet is fluidly coupled to a third fluid delivery zone in the process chamber via a third fluid line, wherein the third flow ratio controller is configured to provide a flow rate of a third process fluid to at least one of the first fluid delivery zone, second fluid delivery zone, or the third fluid delivery zone, wherein the third fluid delivery zone is configured to only receive fluid flow from the third flow ratio controller; and
a controller configured to control each of the first flow ratio controller and the second flow ratio controller to provide a flow ratio of 6:1 to 1:6 between the first fluid delivery zone and the second fluid delivery zone and configured to control the third flow ratio controller to provide a flow ratio of up to 5:1 between any two of the first fluid delivery zone, the second fluid delivery zone, and the third fluid delivery zone.

2. The apparatus of claim 1, wherein the inlet of the first flow ratio controller is fluidly coupled to a first fluid source containing the first process fluid, the inlet of the second flow ratio controller is fluidly coupled to a second fluid source containing the second process fluid, and the inlet of the third flow ratio controller is fluidly coupled to a third fluid source containing the third process fluid, wherein the first fluid source, the second fluid source, and the third fluid source are separate.

3. The apparatus of claim 2, wherein at least one of:
the first fluid source includes one or more of tetrafluoropropene ($C_3H_2F_4$), hexafluoropropene ($C_3F_6$), hexafluorobutadiene ($C_4F_6$), hexafluorocyclopropane ($C_3F_6$), or oxygen ($O_2$), or
wherein the second fluid source includes one or more of fluorocarbon iodide ($CFI_3$), krypton (Kr), argon (Ar), or xenon (Xe).

4. The apparatus of claim 2, wherein the third process fluid is the same as at least one of the first process fluid or the second process fluid.

5. The apparatus of claim 2, wherein the third fluid source includes one or more of tetrafluoropropene ($C_3H_2F_4$), hexafluoropropene ($C_3F_6$), hexafluorobutadiene ($C_4F_6$), hexafluorocyclopropane ($C_3F_6$), oxygen ($O_2$), fluorocarbon iodide ($CFI_3$), krypton (Kr), argon (Ar), or xenon (Xe).

6. The apparatus of claim 1, further comprising a showerhead, wherein the first fluid delivery zone corresponds with a central region of the showerhead, the second fluid delivery zone corresponds with a middle region of the showerhead, and the third fluid delivery zone corresponds with an edge region of the showerhead.

7. The apparatus of claim 1, wherein both the first outlet of the first flow ratio controller and the first outlet of the second flow ratio controller are fluidly coupled to the first fluid line upstream of the first outlet of the third flow ratio controller.

8. The apparatus of claim 1, wherein both the second outlet of the first flow ratio controller and the second outlet of the second flow ratio controller are fluidly coupled to the second fluid line upstream of the second outlet of the third flow ratio controller.

9. The apparatus of claim 1, wherein the first flow ratio controller and the second flow ratio controller comprise a first type of valve, and the third flow ratio controller comprises a second type of valve different than the first type of valve.

10. A flow distribution system, comprising:
a first fluid source to provide a first process fluid, the first fluid source coupled to a first flow ratio controller via a first mass flow controller;

a second fluid source to provide a second process fluid, the second fluid source coupled to a second flow ratio controller via a second mass flow controller;

a third fluid source to provide a third process fluid, the third fluid source coupled to a third flow ratio controller via a third mass flow controller; and a showerhead having a central region, a middle region, and an edge region, and a plurality of inlets configured to deliver the first process fluid, the second process fluid, and the third process fluid at a predetermined flow ratio to each of the central region, the middle region, and the edge region, wherein each inlet of the plurality of inlets is fluidly coupled to at least one of the first flow ratio controller, the second flow ratio controller, and the third flow ratio controller, wherein any inlet of the plurality of inlets corresponding to the edge region is configured to only receive fluid flow only from the third flow ratio controller, wherein the central region corresponds to a first fluid delivery zone, the middle region corresponds to a second fluid delivery zone, and the edge region corresponds to a third fluid delivery zone, wherein first supply lines for delivering the first process fluid from the first mass flow controller to the showerhead include two control valves, wherein second supply lines for delivering the second process fluid from the second mass flow controller to the showerhead include two control valves, and wherein third supply lines for delivering the third process fluid from the third mass flow controller to the showerhead include three on/off valves.

11. The flow distribution system of claim 10, wherein the first fluid source includes one or more of tetrafluoropropene ($C_3H_2F_4$), hexafluoropropene ($C_3F_6$), hexafluorobutadiene ($C_4F_6$), hexafluorocyclopropane ($C_3F_6$), or oxygen ($O_2$).

12. The flow distribution system of claim 10, wherein the second fluid source includes one or more of fluorocarbon iodide ($CFI_3$), krypton (Kr), argon (Ar), or xenon (Xe).

13. The flow distribution system of claim 10, wherein the third fluid source includes one or more of tetrafluoropropene ($C_3H_2F_4$), hexafluoropropene ($C_3F_6$), hexafluorocyclopropane ($C_3F_6$), hexafluorobutadiene ($C_4F_6$), oxygen ($O_2$), fluorocarbon iodide ($CFI_3$), krypton (Kr), argon (Ar), or xenon (Xe).

14. The flow distribution system of claim 10, wherein the first supply lines consist of a primary line that extends directly from the first mass flow controller to the first flow ratio controller and two secondary lines that extend from the first flow ratio controller to the showerhead.

15. An etch chamber, comprising:
a chamber body defining an interior volume therein; and
a flow distribution system, comprising:
a showerhead disposed in the interior volume and having three zones consisting of a central region, a middle region, and an edge region;
a first fluid source disposed outside of the interior volume and having a first process fluid, the first fluid source coupled to a first flow ratio controller via a first mass flow controller;
a second fluid source disposed outside of the interior volume and having a second process fluid, the second fluid source coupled to a second flow ratio controller via a second mass flow controller; and
a third fluid source disposed outside of the interior volume and having a third process fluid, the third process fluid comprising at least one of the first process fluid or the second process fluid, the third fluid source coupled to a third flow ratio controller via a third mass flow controller;
wherein the third flow ratio controller is configured to provide the third process fluid to the three zones of the showerhead in a predetermined ratio via third supply lines that include a primary third supply line that extends directly from the third mass flow controller to the third flow ratio controller and three secondary third supply lines that extend from the third flow ratio controller to the showerhead, wherein the second flow ratio controller is configured to provide the second fluid source to the central region and the middle region in a predetermined ratio without providing the second process fluid to the edge region via second supply lines that consist of a primary second supply line that extends directly from the second mass flow controller to the second flow ratio controller and two secondary second supply lines that extend from the second flow ratio controller to the central region and the middle region, and
wherein the first fluid source is coupled to the showerhead via first supply lines and the first flow ratio controller is configured to provide the first fluid source to the central region and the middle region in a predetermined ratio without providing the first process fluid to the edge region via the first supply lines that consist of a primary first supply line that extends directly from the first mass flow controller to the first flow ratio controller and two secondary first supply lines that extend from the first flow ratio controller to the central region and the middle region, wherein the edge region is configured to only receive fluid flow from the third flow ratio controller.

16. The etch chamber of claim 15, further comprising an RF power source coupled to the showerhead.

* * * * *